(12) United States Patent
Kang et al.

(10) Patent No.: US 6,600,675 B2
(45) Date of Patent: Jul. 29, 2003

(54) REFERENCE CIRCUIT IN FERROELECTRIC MEMORY AND METHOD FOR DRIVING THE SAME

(75) Inventors: Hee Bok Kang, Daejeon-shi (KR); Hun Woo Kye, Kyonggi-do (KR); Duck Ju Kim, Cheju-do (KR); Je Hoon Park, Kyonggi-do (KR); Geun Il Lee, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/170,646

(22) Filed: Jun. 14, 2002

(65) Prior Publication Data

US 2003/0002318 A1 Jan. 2, 2003

(30) Foreign Application Priority Data

Jun. 29, 2001 (KR) .................................. 2001-0038130

(51) Int. Cl.[7] .............................................. G11C 11/22
(52) U.S. Cl. ...................................... 365/145; 365/210
(58) Field of Search ................................ 365/145, 149, 365/210

(56) References Cited

U.S. PATENT DOCUMENTS

| | | | |
|---|---|---|---|
| 5,424,975 A | 6/1995 | Lowrey et al. | |
| 5,598,366 A | 1/1997 | Kraus et al. | |
| 5,680,344 A | 10/1997 | Seyyedy | |
| 5,737,260 A | 4/1998 | Takata et al. | |
| 5,751,626 A | 5/1998 | Seyyedy | |
| 5,847,989 A | 12/1998 | Seyyedy | |
| 5,917,746 A | 6/1999 | Seyyedy | |
| 5,999,439 A | 12/1999 | Seyyedy | |
| 6,333,870 B1 | * 12/2001 | Kang | .................... 365/145 |

* cited by examiner

*Primary Examiner*—Son Mai
(74) *Attorney, Agent, or Firm*—Morgan, Lewis & Bockius LLP

(57) ABSTRACT

A reference circuit in a ferroelectric memory includes a reference plate line and a reference word line adjacently formed in a first direction in correspondence with a cell block including a plurality of unit cells; a plurality of bit lines connected to the unit cells and formed in a second direction; a plurality of parallelly disposed reference capacitors each having a first electrode connected to the reference plate line and a second electrode connected to a storage node SN of a reference cell; an initializing unit connected to the storage node for initializing a level of the reference cell; and a switching block formed between the bit lines and the storage node in correspondence with the bit lines and controlled by signals applied to the reference word line.

16 Claims, 8 Drawing Sheets

REFERENCE CIRCUIT IN FERROELECTRIC MEMORY AND METHOD FOR DRIVING THE SAME

This application claims the benefit of Korean Application No. P2001-38130, filed in Korea on Jun. 29, 2001, which is hereby incorporated by reference.

BACKGROUND OF THE INVENTION

1. Field of the Invention

The present invention relates to a semiconductor memory, and more particularly, to a reference circuit in a ferroelectric memory and a method for driving the same, which can stabilize the reference level and enable a reference capacitor to be commonly used by adjacent cell array blocks in order to reduce a layout area.

2. Discussion of the Related Art

Generally, a nonvolatile ferroelectric memory device, (i.e., ferroelectric random access memory (FRAM)) has a data processing speed that is substantially the same as a dynamic random access memory (DRAM) and also retains data even in power-off. For this reason, the nonvolatile ferroelectric memory has been highly regarded as a next generation memory device.

As a memory device having a structure similar to that of a DRAM, FRAM uses a high residual polarization, which is a characteristic of ferroelectric, by using ferroelectric as a component of a capacitor. Due to such characteristic of a residual polarization, data remains unerased even if the electric field is removed.

FIG. 1 illustrates a hysteresis loop of a typical ferroelectric. As shown in FIG. 1, even if the electric field that induced a polarization is removed, the data is maintained at a certain amount (the "d" and "a" states) due to the presence of the residual polarization (or spontaneous polarization). A nonvolatile ferroelectric memory cell is constructed by regarding the "d" and "a" states as "1" and "0", respectively.

A related art ferroelectric memory device will now be explained with reference to the accompanying drawings. FIG. 2 is a schematic view of a cell array block of a typical ferroelectric memory, and FIG. 3 is a circuit diagram of a main cell in FIG. 2. The cell array block includes a plurality of sub cell arrays. Adjacent top and bottom sub cell arrays sub_T and sub_B are formed, and a sensing amplifier S/A block is formed between the sub cell arrays sub_T and sub_B. That is, one sensing amplifier circuit is correspondingly formed per each bit line, and a column selector CS is formed at the end of the bit line.

Each of the sub cell arrays includes bit line Top_B/L (or Bot_B/L), a plurality of main cells MC connected to the bit line Top_B/L (or Bot_B/L), a reference cell RC connected to the bit lines Top_B/L (or Bot_B/L), and a column selector CS. The column selector CS selectively activates a corresponding column bit line using Y (column) address. If the column selector CS is in the high level, the corresponding column bit line is connected to a data bus to enable data transmission.

The structure of a main cell of the cell array with the aforementioned structure will now be described. As shown in FIG. 3, a main cell MC is constructed such that a bit line B/T is formed in one direction, and a word line W/L is formed to cross the bit line. A plate line P/L is spaced apart from the word line W/L in the same direction as the word line W/L. A transistor T with a gate connected to the word line W/L and a source connected to the bit line B/L is formed. A ferroelectric capacitor FC is formed in such a manner that its first terminal is connected to a drain of the transistor T and its second terminal is connected to the plate line P/L.

The structure and operation of a related art reference cell of a ferroelectric memory with the aforementioned structure will now be described. FIG. 4 is a schematic view of a reference cell of the related art ferroelectric memory. In each reference cell, a bit line B/L is formed in one direction, a reference word line REF_W/L is formed to cross the bit line, a switch block 51 is controlled by a signal on the reference word line to selectively transmit a reference voltage stored in the ferroelectric capacitor bit line. Ferroelectric capacitors are connected to the input terminal of the switching block 51 in parallel. The level initializing block 52 selectively initializes a level of the input terminal of the switching block 51 connected to the ferroelectric capacitors.

The switching block 51 includes an NMOS transistor (also referred to as "first transistor") T1 with a gate connected to the reference word line REF_W/L, a drain connected to the bit line B/L, and a source connected to a storage node SN.

The level initializing block 52 is controlled by a reference cell equalizer control signal REF_EQ, which is a control signal for initializing the storage node SN of the reference cell. The level initializing block 52 includes an NMOS transistor (also referred to as "second transistor") T2 connected between the source of the first transistor T1 and a ground terminal Vss.

The number of ferroelectric capacitors FC1, FC2, FC3, FC4, ..., FCn is determined depending on the capacitor size of the reference cell. The storage node SN is connected with first terminals of the ferroelectric capacitors FC1, FC2, FC3, FC4, ..., FCn in parallel. In other words, FC1 is a basic connection terminal, and FC2, FC3, FC4, ..., FCn may be provided additionally depending on the need.

The reference cell equalizer control signal REF_EQ initializes the storage node to a ground voltage level. Namely, when the reference cell equalizer control signal REF_EQ is in the high level, the second transistor T2 is turned on so that the storage node is maintained at a ground voltage level.

The operation of the aforementioned reference cell will now be described. Qs and Qns of a hysteresis loop of a ferroelectric shown in FIG. 5 denote the switching charge of the ferroelectric capacitor and the non-switching charge of the ferroelectric capacitor, respectively. The reference cell is based on Qns. In other words, the reference word line REF_W/L within the operation cycle is raised to the high level together with the reference plate line REF_P/L. Accordingly, charges equivalent to the size of Qns× (ferroelectric capacitor) are supplied to the bit line B/L. In this case, the reference word line REF_W/L is changed to the low level before the sensing amplifier is operated, so that the reference cell is not affected by a voltage of the bit line. Meanwhile, the reference plate line REF_P/L is maintained at the high level, and is changed to the low level when the reference word line is sufficiently stabilized.

As described above, since non-switching charges Qns are used, a separate restoring operation is not required during a precharge period. Accordingly, the high level in the reference word line REF_W/L is not required any longer than this.

Since the reference level is affected by an initial level of the storage node SN, the second transistor T2 of FIG. 4 is used to stabilize the storage node SN, and the reference equalizer control signal REF_EQ is used to initialize the storage node to the ground voltage level. Therefore, since the initial level of the storage is maintained at the ground voltage level, the reference level can be stabilized.

The method of operation will now be described with reference to a hysteresis loop and a timing chart of the reference cell. FIG. 5 is a hysteresis loop of the reference cell of the related art ferroelectric memory, and FIG. 6 is a timing chart illustrating the operation of a reference cell according to the related art. Referring to FIG. 6, an operation cycle begins as a chip enable signal CEBpad is changed to the low level, so that active periods A, B, and C are formed. A precharge period D begins as the chip enable signal CEBpad is changed to the level. One cycle is completed by passing through the precharge period.

When the active period of the chip begins, an address is decoded during the periods A and B. Then, various control signals are activated, and the reference word line REF_W/L and the reference plate line REF_P/L are changed from the low level to the high level. As the reference word line REF_W/L and the reference plate line REF_P/L are changed from the low level to the high level, the reference cell data are transmitted to each bit line in the period C.

Then, reference plate line REF_P/L is changed to the low level in the precharge period D. Therefore, by maintaining the low level in the remaining periods, the reference plate line REF_P/L is maintained at the low level, thereby preventing voltage to pass through the both electrodes of the reference cell in the ferroelectric capacitor. From a moment that the reference plate line REF_P/L is changed from the high level to the low level, the reference plate line REF_P/L is changed from the "a" state to the "b" state as time passes.

Therefore, depending on a lapse of time after the reference plate line REF_P/L is changed from the high level to the low level, a non-destructive charge varies between the value Qns and the value Q'ns.

Due to such inconsistency of the non-destructive charge, the reference bit line REF_B/L level maintained by the non-destructive charge also varies accordingly. Therefore, due to the Qns and Q'ns values, the reference level varies inconsistently and so reduces the sensing margin.

The aforementioned ferroelectric memory device and method for driving a reference cell of the related art has the following disadvantages. Since the non-destructive charge is not constant, the reference bit line level is also changed. As a result, the reference level is not constant and changes under the influence of Qns and Q'ns, thereby reducing the sensing margin.

Particularly, time dependency has a large effect on a ferroelectric capacitor. This results in a variation in charge amount due to a charge and discharge time, which leads to a large change in the reference level.

In the related art ferroelectric memory device, only voltage is used to form a reference level, resulting in that the reference level is remarkably varied. In other words, the related art capacitor is highly dependent on time.

SUMMARY OF THE INVENTION

Accordingly, the present invention is directed to a reference circuit in a ferroelectric memory and a method for driving the same that substantially obviate one or more of the problems due to limitations and disadvantages of the related art.

An object of the present invention is to provide a reference circuit in a ferroelectric memory and a method for driving the same that can stabilize a reference level.

Another object of the present invention is to provide a reference circuit in a ferroelectric memory and a method for driving the same that enable a reference capacitor to be commonly used by adjacent cell array blocks in order to reduce a layout area.

Still another object of the present invention is to provide a reference circuit in a ferroelectric memory and a method for driving the same that can stabilize a reference level and enable a reference capacitor to be commonly used by adjacent cell array blocks in order to reduce a layout area.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a reference circuit in a ferroelectric according to one aspect of the present invention includes a reference plate line and a reference word line adjacently formed in a first direction in correspondence with a cell block including a plurality of unit cells, a plurality of bit lines connected to the unit cells and formed in a second direction, a plurality of parallel reference capacitors having a first electrode connected to the reference plate line and a second electrode connected to a storage node SN of a reference cell, an initializing unit connected to the storage node and initializing a level of the reference cell, and a switching block and formed between the bit line and the storage node in correspondence with the bit lines and controlled by signals applied to the reference word line.

In another aspect of the present invention, a method for driving a reference circuit of a ferroelectric memory includes transiting a chip enable signal CEBpad from high level to low level so as to activate a chip, transiting an applied signal of a reference plate line to low level at a starting point of an active period, controlling a pulse time of this period, and controlling an amount of linear Qns charge in the reference capacitor, simultaneously transiting applied signals of the reference word line and the reference plate line to high level at an ending point of reference capacitor charge and discharging the reference cell data to each bit line, controlling an amount of electric charges discharged to the bit lines by using the pulse time in a period maintaining high level of a reference word line and transiting an applied signal of the reference word line to low level, and transiting an active signal of a bit line sensing amplifier to high level at a point where the level of the reference word line is changed to low level.

In another aspect, the present invention provides a reference circuit in a ferroelectric memory, including a reference plate line and a reference word line adjacently formed in a first direction in correspondence with a cell block including a plurality of unit cells; a plurality of bit lines connected to the unit cells and formed in a second direction; a plurality of parallelly disposed reference capacitors each having a first electrode connected to the reference plate line and a second electrode connected to a storage node SN of a reference cell; an initializing unit connected to the storage node for initializing a level of the reference cell; and a switching block formed between the bit lines and the storage node in correspondence with the bit lines and controlled by signals applied to the reference word line.

In a further aspect, the present invention provides a method for driving a reference circuit of a ferroelectric memory, the method including the steps of changing a chip enable signal from a high level to a low level so as to activate a chip; changing a signal applied to a reference plate line to a low level at a starting point of an active period and maintaining said signal in the low level for a specified duration to control the amount of a linear charge Qns in a reference ferroelectric capacitor; simultaneously changing signals applied to a reference word line and the reference plate line to respective high levels at an ending point of said specified duration to discharge reference cell data to each bit line; changing the signal applied to the reference word line to a low level when a specified time has elapsed from said ending point of said specified duration to control the amount of electric charges discharged to the bit lines; and changing an active signal of a bit line sensing amplifier to a high level at substantially the same time as changing the signal applied to the reference word line to the low level.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE PREFERRED EMBODIMENTS

Reference will now be made in detail to the preferred embodiments of the present invention, examples of which are illustrated in the accompanying drawings.

Figure 7:
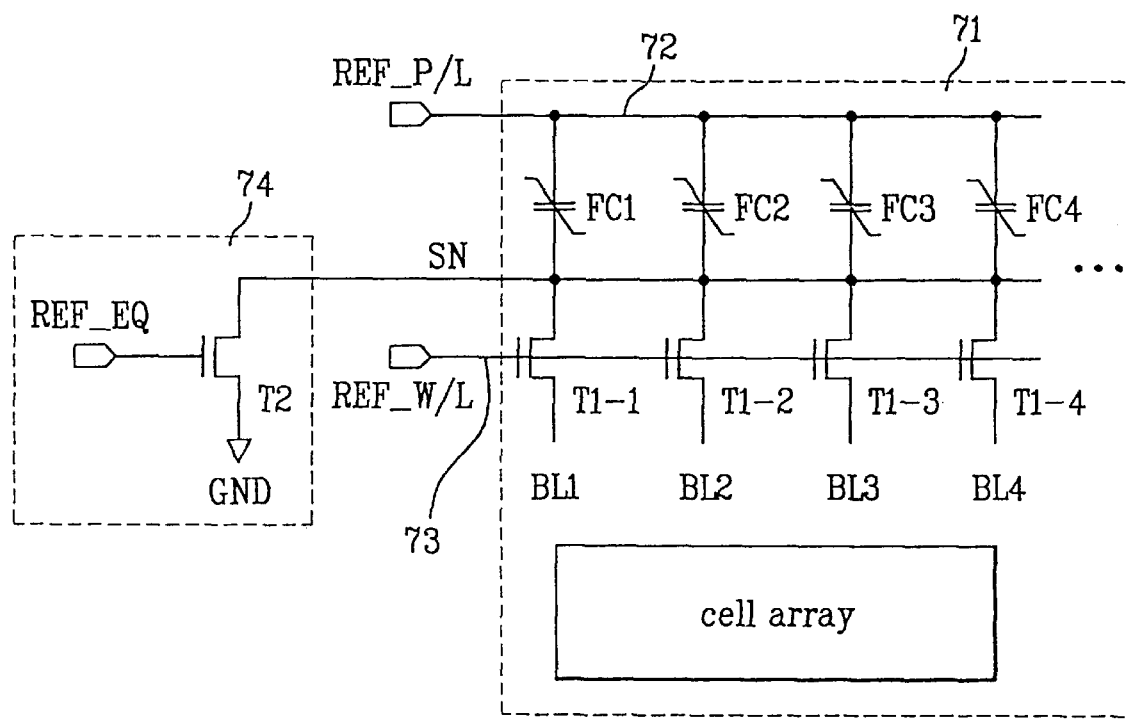
FIG. 7 is a schematic view of a reference cell of a ferroelectric memory according to an embodiment of the present invention.
Figure 8:
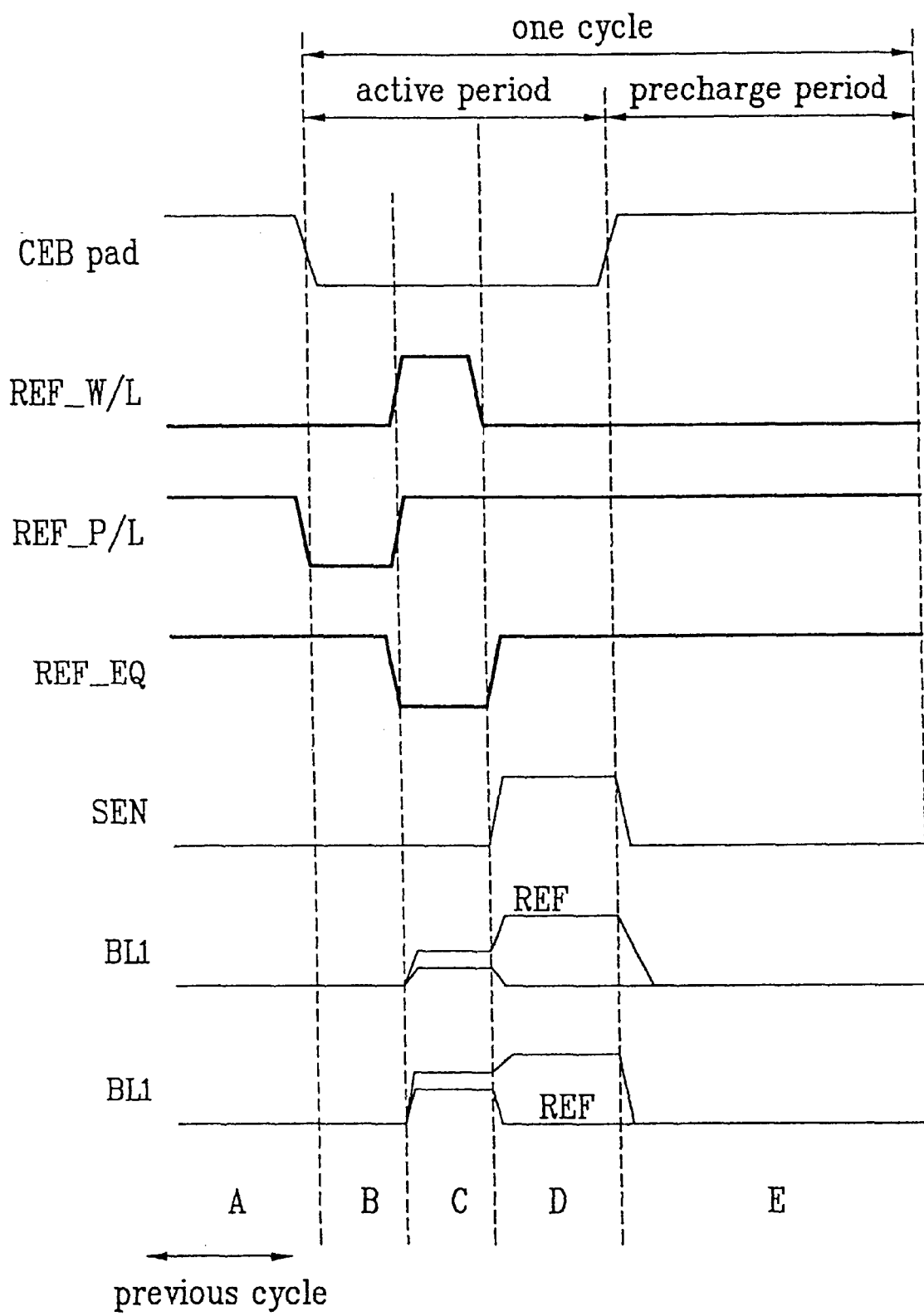
FIG. 8 is a timing chart illustrating the operation of the reference cell of FIG. 7.

FIG. 7 is a schematic view of a reference cell of a ferroelectric memory according to an embodiment of the present invention. FIG. 8 is a timing chart illustrating the operation of the reference cell of FIG. 7. When a ferroelectric memory is not driven for a long period of time, +Pr or −Pr levels degrade, which are initial states of the cell capacitor, and therefore their sizes are varied. This causes a difference in level as compared to situations where the ferroelectric memory is not driven for only a short period of time.

In other words, the state of the reference cell, which has more movement than the main cells, is not equal to the state of the main cell. Therefore, the difference in Pr value between the two cells becomes larger, which makes the reference level unstable.

The present invention is designed to stabilize the inconsistency of the reference level that occurs due to the difference in time, and provides that the charging time and the discharging time are made uniform in order to utilize the time dependency of the capacitor.

As shown in FIG. 7, the reference circuit of a ferroelectric memory according to this example of the present invention includes a plurality of bit lines BL1, BL2, BL3, . . . , and BLn formed in one direction within the unit cell block 71, one reference word line REF_W/L 73 formed in a direction perpendicular to the bit lines, and a reference plate line REF_P/L 72 formed in the same direction as the reference word line REF_W/L 73. The reference circuit also includes a plurality of reference capacitors FC1, FC2, FC3, . . . , and FCn arranged in parallel, each having a first electrode connected to the reference plate line REF_P/L 72 and a second electrode connected to a storage node SN of the reference cell, a level initializing unit 74 formed of an NMOS transistor T2 having a reference cell equalizer control signal REF_EQ applied to a gate, one electrode connected to a ground terminal GND and another electrode connected to the storage node SN, and a switching block consisting of a plurality of NMOS transistors T1-1, T1-2, T1-3, . . . , and T1-n having one electrode connected in association with each bit line, another electrode connected to a storage node SN of a reference capacitor, and a gate jointly connected to the reference word line REF_W/L.

This reference circuit is formed in correspondence with a unit cell block, which is included in a plurality of sub cell arrays formed inside a cell array. A cell array block includes a plurality of sub cell arrays. A sensing amplifier S/A is formed between adjacent top sub cell array sub_T and bottom sub cell array sub_B. Also, a sensing amplifier circuit is formed in each bit line, and a column selector is formed at the end of each bit line.

Figure 1:
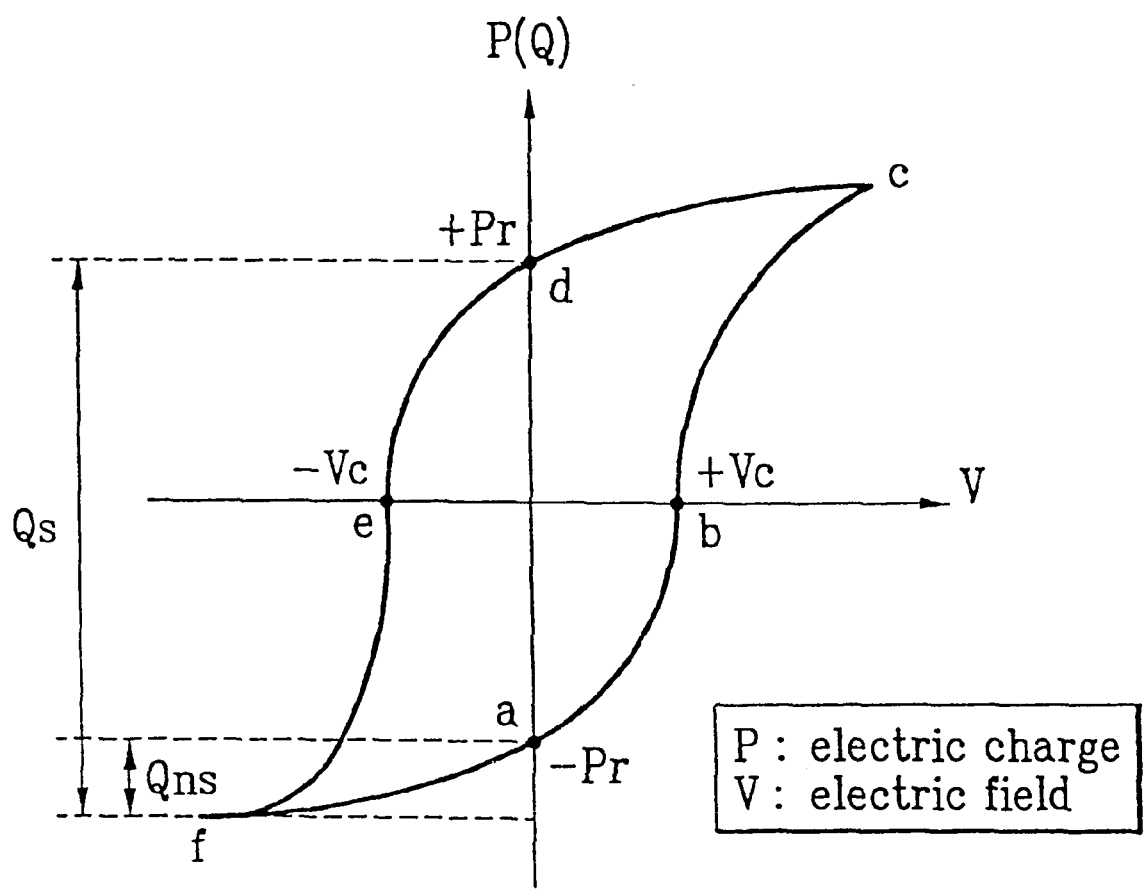
FIG. 1 is a hysteresis loop of a typical ferroelectric.
Figure 2:
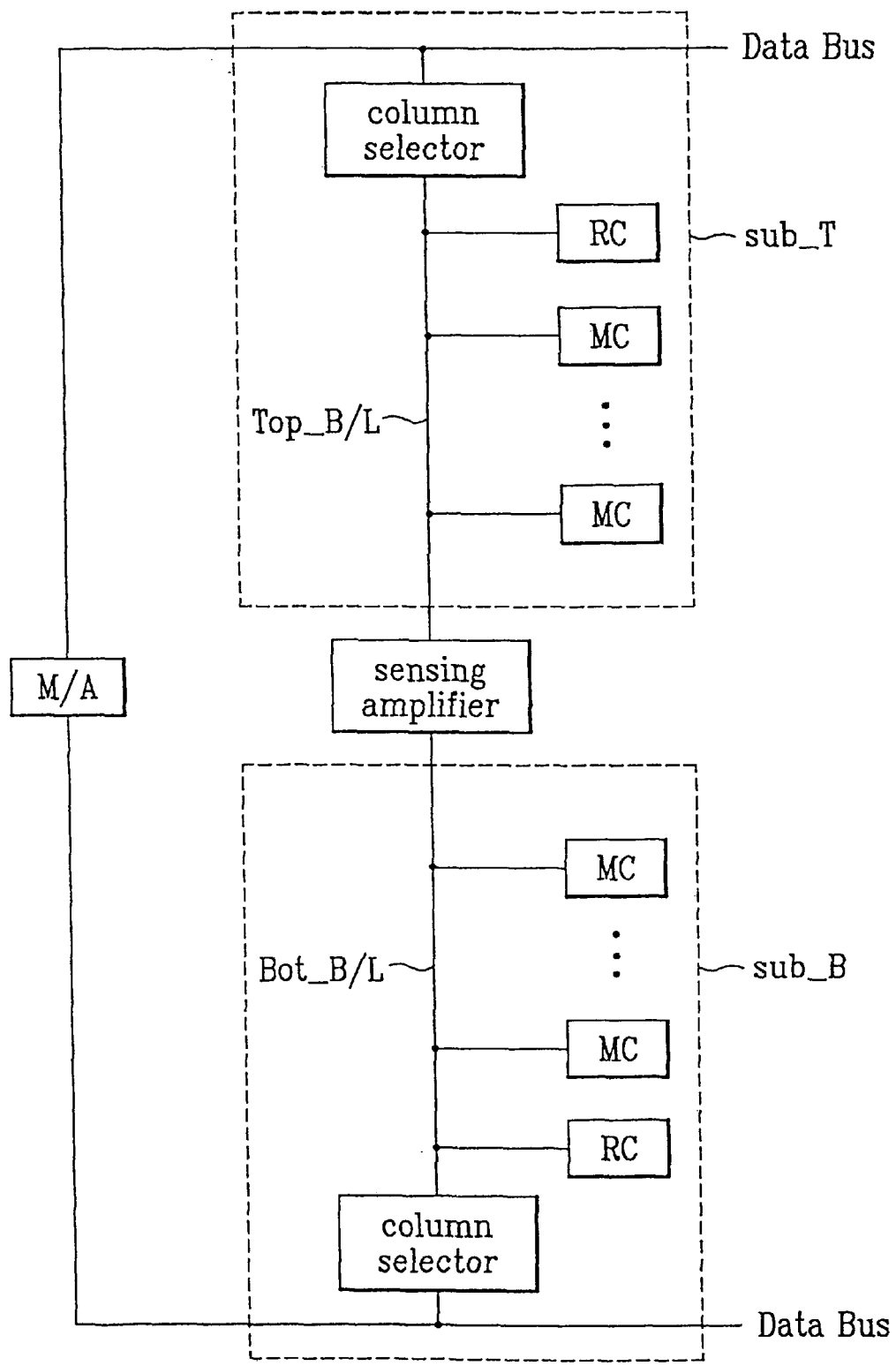
FIG. 2 is a schematic view of a cell array block of a related art ferroelectric memory.

Each of the sub cell arrays generally includes bit lines Top_B/L (or Bot_B/L), a plurality of main cells MC connected to the bit lines Top_B/L (or Bot_B/L), a reference cell RC connected to the bit lines Top_B/L (or Bot_ B/L), and a column selector CS. The column selector CS selectively activates a corresponding column bit line using Y (column) address. If the column selector CS is in the high level, the corresponding column bit line is connected to a data bus to enable data transmission. These basic structures of the sub cell arrays are similar to those depicted in FIG. 2.

Figure 3:
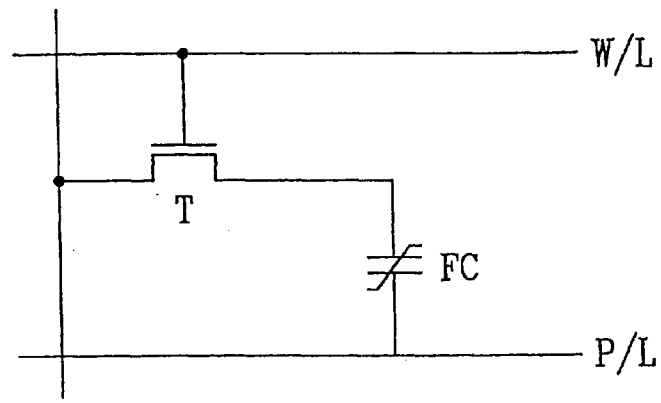
FIG. 3 is a circuit diagram of a main cell in FIG. 2.
Figure 4:
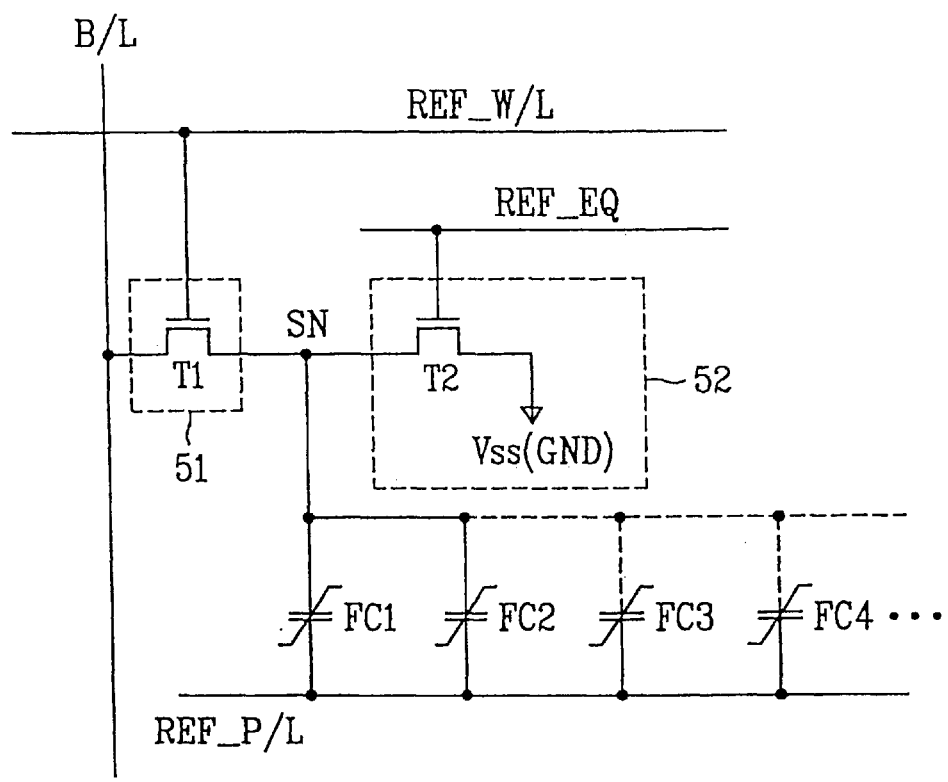
FIG. 4 is a schematic view of a reference cell of the related art ferroelectric memory.

The structure of the main cell in the cell array of the present example will now be described. In the main cell MC, a bit line B/T is formed in one direction, and a word line W/L is formed to cross the bit line. A plate line P/L is spaced apart from the word line W/L in the same direction as the word line W/L. A transistor T with a gate connected to the word line W/L and a source connected to the bit line B/L is formed. A ferroelectric capacitor FC is formed in such a manner that its first terminal is connected to a drain of the transistor T and its second terminal is connected to the plate line P/L. Each of ferroelectric capacitors FC1, FC2, FC3, . . . , and FCn includes a first electrode, a second electrode, and a ferroelectric material formed between the two electrodes. Thus, the structure of the main cell is similar to that depicted in FIG. 3.

The reference cell equalizer control signal REF_EQ initializes the storage node to a ground voltage level.

Namely, when the reference cell equalizer control signal REF_EQ is in the high level, the NMOS transistor T2 is turned on so that the storage node is maintained at a ground voltage level.

The operation of the aforementioned reference cell of a ferroelectric memory according to this embodiment of the present invention will now be described with reference to FIG. 8. One cycle begins as the chip enable signal CEBpad is changed to low level so as to form active periods B, C, and D. Then, as the chip enable signal CEBpad is changed to high level, a precharge period E begins, after which the cycle ends.

When the active period of the chip begins, during period B, the address is decoded and several control signals are activated to change the level of the reference word line 73 and the reference plate line 72 from the low level to the high level. As the reference word line 73 and the reference plate line 72 are changed from the low level to the high level, the reference cell data is transmitted to each bit line in period C.

The reference plate line signal REF_P/L is in the low level only during period B and is in the high level in the other periods. The reference word line signal REF_W/L is in the high level only during period C and in the low level in the other periods. The reference cell equalizer control signal REF_EQ is in the low level only during period C and in the high level in the other periods.

As an activating signal of the bit line sensing amplifier, SEN is maintained at the high level during period D to activate the sensing amplifier. The BL signals are activated in period C so as to transmit the main cell data and the reference data to the corresponding bit lines, and are amplified in period D by the SEN. The reference plate line signal REF_P/L and the reference cell equalizer control signal REF_EQ maintain their respective high levels during the precharge periods A and E. Therefore, when the power is turned on, the reference plate line 72 essentially maintains the high level so that the status of the ferroelectric in the ferroelectric capacitors FC1, FC2, FC3, . . . , FCn is located at point "f" in the hysteresis loop of FIG. 5.

Figure 5:
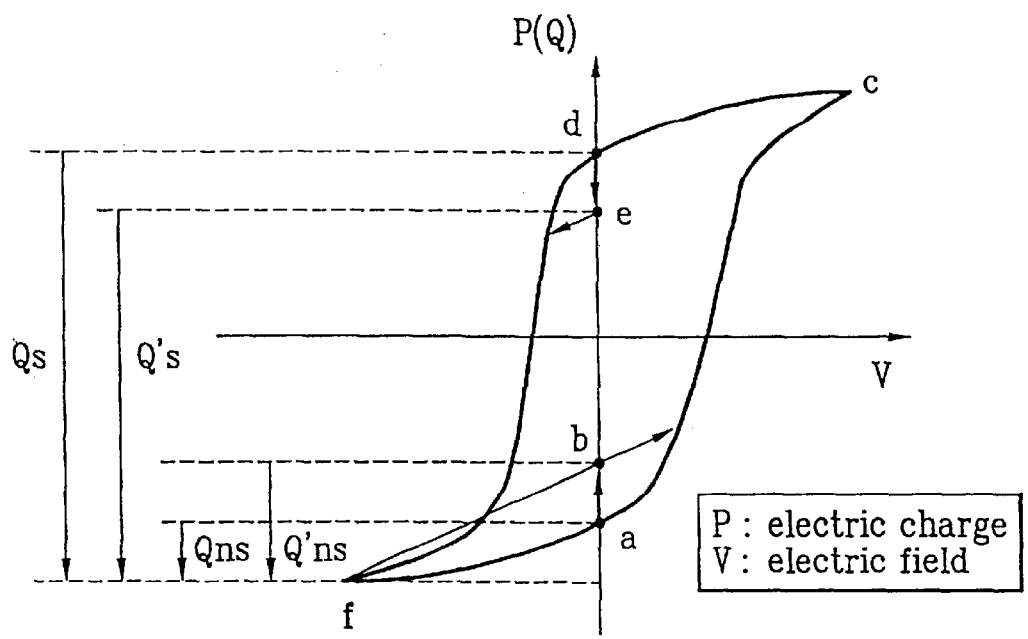
FIG. 5 is a hysteresis loop of a reference cell of the related art ferroelectric memory.
Figure 6:
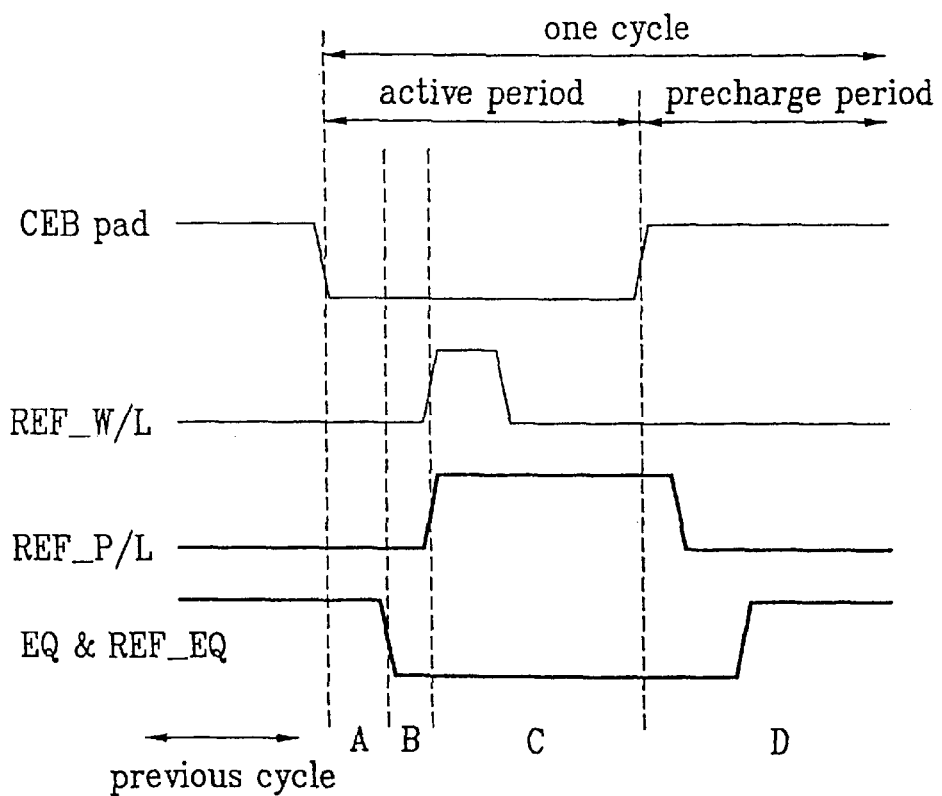
FIG. 6 is a timing chart illustrating the operation of a reference cell according to the related art.

At the beginning of the active period (at the beginning of period B), the reference plate line signal REF_P/L is changed to the low level, and accordingly, the status point shifts from point "f" to point "a" in the hysteresis loop of FIG. 5.

The reference plate line 72 charges the reference capacitors with a linear charge Qns only during period D. In other words, the ferroelectric capacitor is highly dependent on time when charging and discharging. This time dependency is controlled, as follows. First, when charging, the time dependency is controlled by properly determining the pulse time of period B, and when discharging, time dependency is controlled by properly determining the pulse time of period C.

After charging during period B, the reference word line 73 is turned on and the reference plate line 72 is changed from the low level to the high level. Namely, as shown in FIG. 5, by shifting from point "f" to point "a", the electric charge of the reference capacitor is discharged to the bit line during period C. Therefore, only Qns is always present, and Q'ns is not present. In addition, due to the control of the charge and discharge times by periods B and C, the charged and discharged amounts of the reference capacitors become more accurate.

By steadily maintaining the non-destructive charge, which is charged and discharged in the aforementioned manner, the resulting reference bit line level also becomes steady, thereby enhancing the sensing margin. In other words, the Q'ns of a reference ferroelectric capacitors may vary significantly, but the Qns with the controlled time remains stable and unchanged, thereby yielding a constant reference bit line level.

Figure 9:
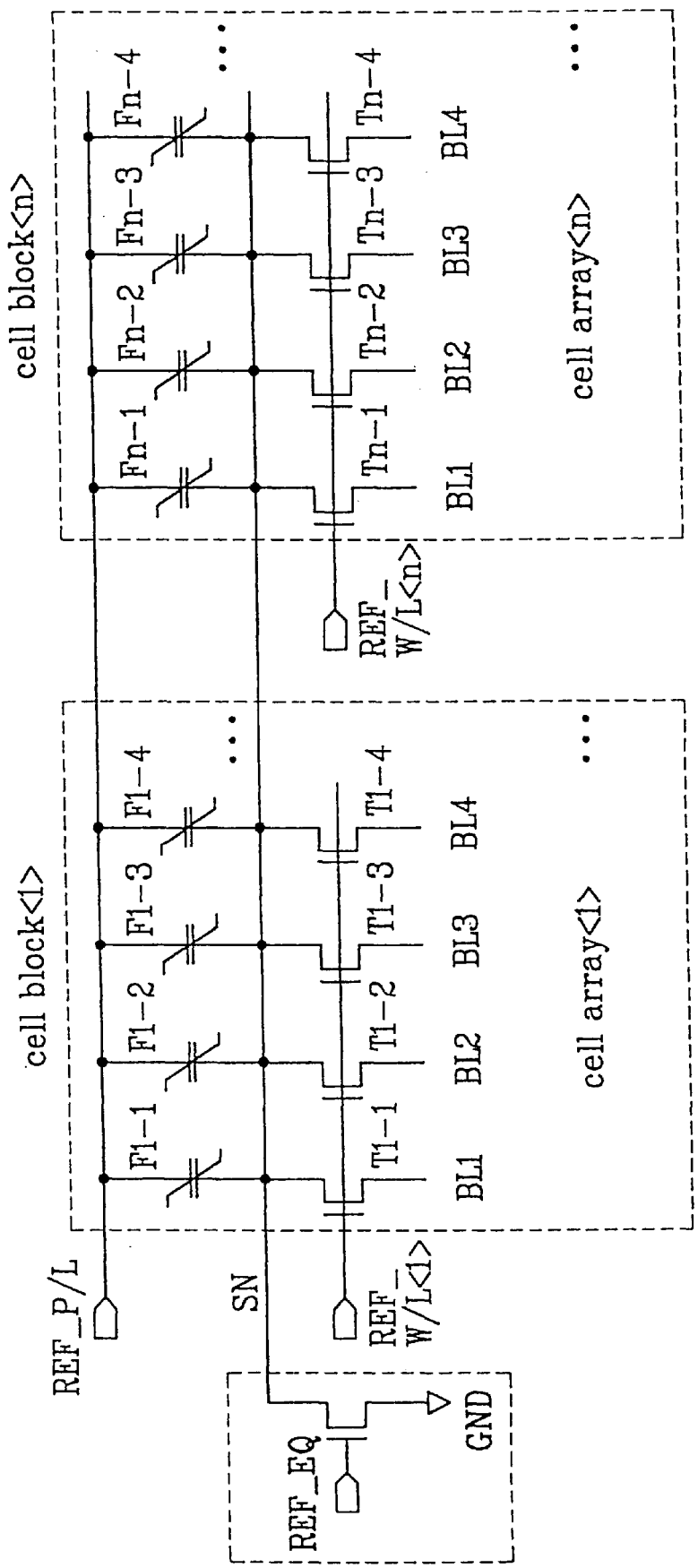
FIG. 9 is a schematic view illustrating a state in which reference capacitors are shared among adjacent cell array blocks according to an embodiment of the present invention.
Figure 10:
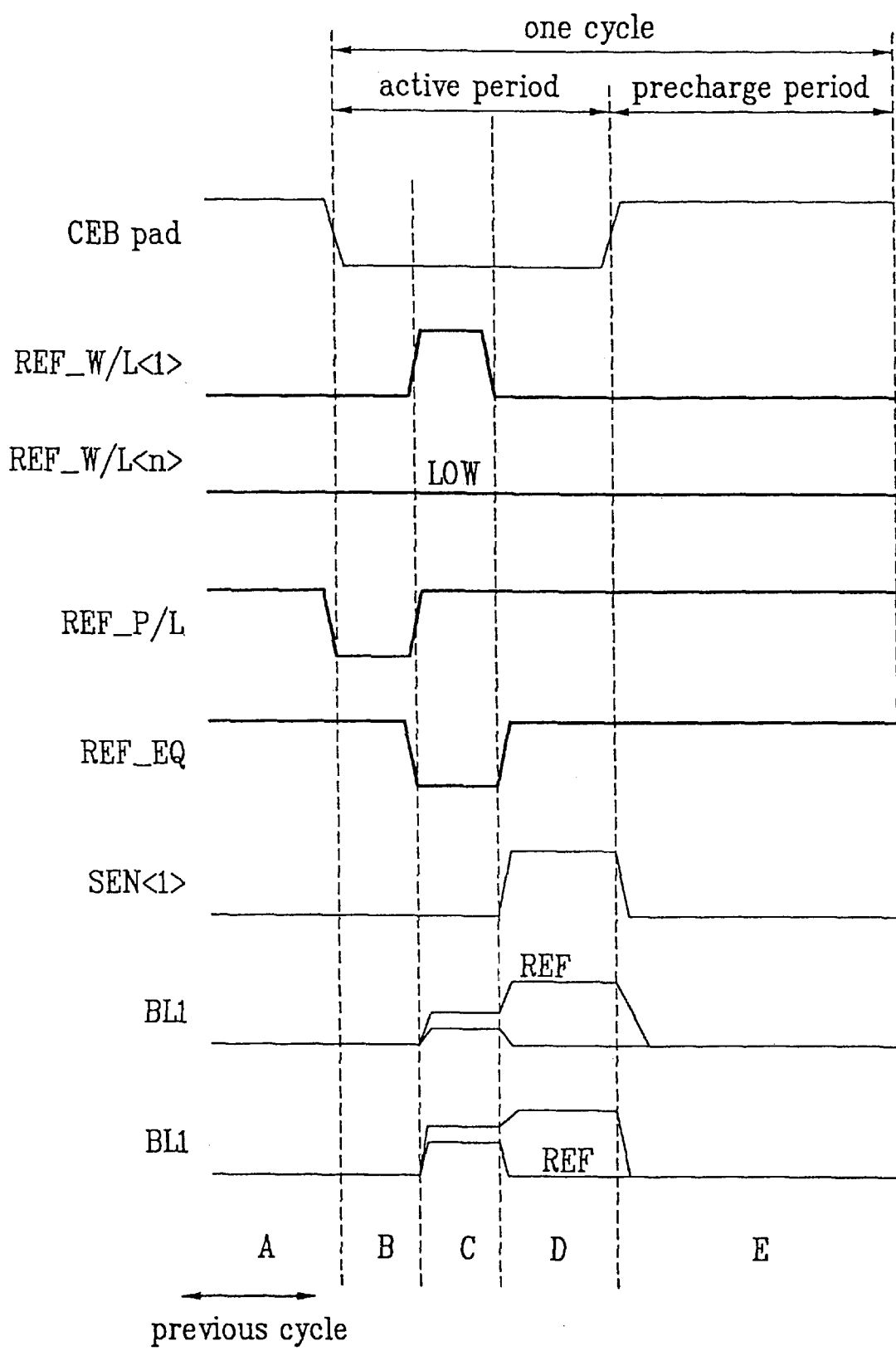
FIG. 10 is a timing chart illustrating the operation of the reference cell in FIG. 9.

A reference cell of a ferroelectric memory according to another embodiment of the present invention will now be described. This example couples two or more of adjacent blocks. FIG. 9 is a schematic view illustrating a state in which reference cells described above are commonly operated in adjacent cell array blocks. FIG. 10 is a timing chart illustrating the operation of a reference cell in FIG. 9.

As shown in FIG. 9, the reference cell of a ferroelectric memory of this example includes a plurality of cell blocks 1, 2, 3, . . . , and n, a plurality of bit lines BL1, BL2, BL3, . . . , and BLn formed in one direction within each cell block, reference word lines REF_W/L<1>, REF_W/L<2>, . . . , and REF_W/L<n> formed in a direction perpendicular to the bit lines and in correspondence with each cell block, and a reference plate line REF_P/L formed in the same direction as the reference word lines and commonly used by the entire cell blocks. The reference cell further includes a plurality of reference capacitors (F1-1, F1-2, F1-3, . . . , and F1-$n$), (F2-1, F2-2, F2-3, . . . , and F2-$n$), . . . , and (Fn-1, Fn-2, Fn-3, . . . , and Fn-n) formed in parallel within the respective cell blocks. Each of the reference capacitors has a first electrode connected to the reference plate line REF_P/L and a second electrode connected to a storage node SN of the reference cell. The reference cell of this example also includes a level initializing unit constructed of an NMOS transistor having a reference cell equalizer control signal REF_EQ applied to a gate, one electrode connected to a ground terminal GND, and another electrode connected to a storage node SN, and a plurality of NMOS transistors (T1-1, T1-2, T1-3, . . . , and T1-$n$), (T2-1, T2-2, T2-3, . . . , and T2-$n$), . . . , and (Tn-1, Tn-2, Tn-3, . . . , and Tn-n) having a gate jointly connected to the reference word lines REF_W/L<1>, REF_W/L<2>, . . . , and REF_W/L<n>, respectively, one electrode correspondingly connected to each bit line, and another electrode connected to the storage node SN of the reference capacitor.

In this case, the storage node SN is jointly connected to all the second electrodes of the reference capacitors in the cell blocks. Also, the storage node SN is controlled by an external reference cell equalizer control signal REF_EQ through the level initiating unit.

The reference circuit of the ferroelectric memory of the present invention has a shared structure with all the cell blocks. More specifically, all the cell blocks share the same storage node SN and the same reference plate line REF_P/L. However, each reference word line (REF_W/L<1>, REF_W/L<2>, . . . , REF_W/L<n>) has a separate structure specific to each cell block. Accordingly, all reference capacitors can be commonly used and controlled, and contribute to the size of a reference capacitance as a whole. Therefore, the size of each capacitor can be reduced without using much electric current.

FIG. 10 is a timing chart illustrating the operation of the reference cell of FIG. 9. The basic operation is similar to that illustrated in FIG. 8. An operation cycle begins as chip enable signal CEBpad is changed to the low level, so that active periods B, C, and D are formed. A precharge period E begins as the chip enable signal CEBpad is changed to the high level. One cycle is completed by passing through the precharge period.

As explained above, when the active period of the chip begins, the address is decoded during period B and several control signals are activated so that the reference word line and the reference plate line are changed from the low level to the high level. As the reference word line and the reference plate line are changed from the low level to the high level in period C, the reference cell data is transmitted to each bit line.

However, in this example, the reference word line signal REF_W/L of only the selected cell block is maintained at the high level during period C (and is in the low level in all other periods). The reference word line signal REF_W/L of the other cell blocks that are not selected are maintained at the low level in all periods.

The aforementioned examples of the reference circuit in a ferroelectric memory and the method for driving the same according to the present invention have the following advantages. First, by controlling the pulse time when charging and discharging the reference capacitor, accurate control of the charged and discharged amount of electric charge becomes possible. In other words, by maintaining a constant non-destructive electric charge, the sensing margin of the ferroelectric memory is enhanced.

In addition, other reference capacitors can be arranged to be commonly used and controlled when determining the size of a reference capacitor. Therefore, the size can be reduced without using much electric current.

It will be apparent to those skilled in the art that various modifications and variations can be made in the reference circuit in a ferroelectric memory and method for driving the same of the present invention without departing from the spirit or scope of the invention. Thus, it is intended that the present invention cover the modifications and variations of this invention provided they come within the scope of the appended claims and their equivalents.

What is claimed is:

1. A reference circuit in a ferroelectric memory comprising:
    a reference plate line and a reference word line adjacently formed in a first direction in correspondence with a cell block including a plurality of unit cells;
    a plurality of bit lines connected to the unit cells and formed in a second direction;
    a plurality of parallelly disposed reference capacitors each having a first electrode connected to the reference plate line and a second electrode connected to a storage node SN of a reference cell;
    an initializing unit connected to the storage node for initializing a level of the reference cell; and
    a switching block formed between the bit lines and the storage node in correspondence with the bit lines and controlled by signals applied to the reference word line.

2. The reference circuit according to claim 1, wherein the switching block includes a plurality of NMOS transistors each having one electrode connected to the corresponding bit line, another electrode connected to the storage node SN, and a gate jointly connected to the reference word line.

3. The reference circuit according to claim 1, wherein the initializing unit includes an NMOS transistor configured to receive a reference cell equalizer control signal at its gate, said NMOS transistor having one electrode connected to a ground terminal GND and another electrode connected to the storage node SN.

4. The reference circuit according to claim 3, wherein the NMOS transistor is configured to be turned on when the reference cell equalizer control signal is in a high level so that the storage node is maintained at a ground voltage level.

5. The reference circuit according to claim 1, wherein the unit cells are each formed within a crossing region of a bit line, which is formed in one direction, and a word line, which is formed to cross the bit line, each of the unit cells including:
    a transistor with a gate connected to the word line and a source connected to the bit line; and
    a ferroelectric capacitor having a first terminal connected to a drain of said transistor and a second terminal connected to a plate line, which is spaced apart from the word line W/L and extends in the same direction as the word line.

6. The reference circuit according to claim 1, wherein all of the second electrodes of the plurality of reference capacitors are connected to the storage node, thereby enabling the storage node to be commonly used when a reference level occurs.

7. A reference circuit in a ferroelectric memory having a plurality of cell blocks, each of which includes a plurality of unit cells and a plurality of bit lines formed in one direction, the reference circuit comprising:
    reference word lines formed in a direction substantially perpendicular to the bit lines and each in correspondence with a cell block;
    a plurality of reference capacitors formed in parallel in each cell block, each of the reference capacitors having a first electrode connected to a reference plate line and a second electrode connected to a storage node, the reference plate line and the storage node being commonly shared by at least two cell blocks;
    an initializing unit connected to the storage node for initializing a level of a reference cell; and
    switching blocks in correspondence with the bit lines, formed between the bit lines and the storage node, each cell block being provided with one switching block connected to the corresponding reference word line that is controlled by signals applied thereto.

8. The reference circuit according to claim 7, wherein each switching block includes a plurality of NMOS transistors each jointly connected to the corresponding reference word line at its gate, each of the NMOS transistors having one electrode connected to a bit line in the cell block and another electrode connected to the storage node.

9. The reference circuit according to claim 7, wherein the initializing unit includes an NMOS transistor configured to receive a reference cell equalizer control signal at its gate, said NMOS transistor having one electrode connected to a ground terminal GND and another electrode connected to the storage node.

10. The reference circuit according to claim 7, wherein all cell blocks commonly share the storage node SN and the reference plate line so that the reference capacitors can be commonly used and controlled, thereby effectively increasing the total capacitance of the reference capacitors in operation.

11. A method for driving a reference circuit of a ferroelectric memory, the method comprising the steps of:
    changing a chip enable signal from a high level to a low level so as to activate a chip;
    changing a signal applied to a reference plate line to a low level at a starting point of an active period and maintaining said signal in the low level for a specified duration to control the amount of a linear charge Qns in a reference ferroelectric capacitor;
    simultaneously changing signals applied to a reference word line and the reference plate line to respective high levels at an ending point of said specified duration to discharge reference cell data to each bit line;

changing the signal applied to the reference word line to a low level when a specified time has elapsed from said ending point of said specified duration to control the amount of electric charges discharged to the bit lines; and changing an active signal of a bit line sensing amplifier to a high level at substantially the same time as changing the signal applied to the reference word line to the low level.

12. The method according to claim 11, wherein the chip enable signal is changed to a high level at an ending point of the active period from which a precharge period begins.

13. The method according to claim 12, wherein a reference cell equalizer control signal, which initializes a storage node of the reference ferroelectric capacitor, and the signal applied to the reference plate line are maintained at respective high levels during the precharge period.

14. The method according to claim 11, wherein the active signal of the bit line sensing amplifier amplifies the bit line to which main cell data and reference data are applied, as the bit line is activated at a point when the applied reference word line signal and the signal applied to the reference plate line are simultaneously changed to respective high levels.

15. A method for driving a reference circuit of a ferroelectric memory having a plurality of cell blocks that commonly share a reference plate line and a storage node of a cell capacitor, the method comprising:

changing a chip enable signal from a high level to a low level to activate a chip;

changing a signal applied to a reference plate line to a low level at a starting point of an active period and maintaining said signal in the low level for a specified duration to control the amount of a linear charge Qns in a reference ferroelectric capacitor;

simultaneously changing signals applied to a reference word line of one selected cell block and the reference plate line to respective high levels at an ending point of said specified duration to discharge reference cell data to each bit line in that cell block;

changing the signal applied to said reference word line to a low level when a specified time has elapsed from said ending point of said specified duration to control the amount of electric charges discharged to the bit lines; and changing an active signal of a bit line sensing amplifier to a high level at substantially the same time as changing the signal applied to said reference word line to the low level.

16. The method of claim 15, wherein in the step of simultaneously changing, the reference word lines corresponding to the other cell blocks are provided with a low level signal, thereby being inactivated.

* * * * *